(12) United States Patent
Wang et al.

(10) Patent No.: US 11,114,518 B2
(45) Date of Patent: Sep. 7, 2021

(54) WIRING STRUCTURE, DISPLAY SUBSTRATE AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Benlian Wang, Beijing (CN); Li Wang, Beijing (CN); Yipeng Chen, Beijing (CN); Yueping Zuo, Beijing (CN); Zheng Liu, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 714 days.

(21) Appl. No.: 15/779,658

(22) PCT Filed: Nov. 7, 2017

(86) PCT No.: PCT/CN2017/109716
§ 371 (c)(1),
(2) Date: May 29, 2018

(87) PCT Pub. No.: WO2018/196325
PCT Pub. Date: Nov. 1, 2018

(65) Prior Publication Data
US 2021/0175312 A1  Jun. 10, 2021

(30) Foreign Application Priority Data
Apr. 28, 2017  (CN) .......................... 201710297280.0

(51) Int. Cl.
*H01L 27/32* (2006.01)
*H01L 51/00* (2006.01)

(52) U.S. Cl.
CPC ...... *H01L 27/3276* (2013.01); *H01L 51/0097* (2013.01); *H01L 2251/5338* (2013.01)

(58) Field of Classification Search
None
See application file for complete search history.

(56) References Cited

U.S. PATENT DOCUMENTS

2014/0217373 A1  8/2014  Youn et al.
2016/0087024 A1* 3/2016  Son .................. H01L 51/0097
257/40

(Continued)

FOREIGN PATENT DOCUMENTS

CN  105183219 A  12/2014
CN  105144270 A  12/2015

(Continued)

OTHER PUBLICATIONS

First Office Action from Chinese Patent Application No. 201710297280.0 dated Nov. 5, 2018.

(Continued)

*Primary Examiner* — J. E. Schoenholtz
*Assistant Examiner* — Joe Schoenholtz
(74) *Attorney, Agent, or Firm* — Calfee, Halter & Griswold LLP

(57) ABSTRACT

The application discloses a wiring structure, a display substrate and a display device. The wiring structure provided includes a plurality of hollowed pattern strings, each hollowed pattern string including a plurality of hollowed patterns arranged sequentially in a length extension direction of the wiring structure, each hollowed pattern including a hollowed region and a non-hollowed region. The non- (Continued)

hollowed region of any hollowed pattern in a hollowed pattern string at least partially overlaps the non-hollowed region of a hollowed pattern in a further hollowed pattern string adjacent to the hollowed pattern string, and the hollowed regions of the hollowed patterns in the plurality of hollowed pattern strings do not overlap each other. The wiring structure is particularly adapted for flexible display.

14 Claims, 3 Drawing Sheets

(56) References Cited

U.S. PATENT DOCUMENTS

| | | |
|---|---|---|
| 2016/0357052 A1 | 12/2016 | Kim et al. |
| 2017/0060281 A1 | 3/2017 | Xie et al. |
| 2017/0302772 A1 | 10/2017 | Zhang et al. |

FOREIGN PATENT DOCUMENTS

| | | |
|---|---|---|
| CN | 204885164 U | 12/2015 |
| CN | 205140985 U | 4/2016 |
| CN | 205881905 U | 1/2017 |
| CN | 106486500 A | 3/2017 |
| CN | 107039397 A | 8/2017 |
| WO | 2016053246 A1 | 4/2016 |

OTHER PUBLICATIONS

Search Report and Written Opinion for International Application No. PCT/CN2017/109716 dated Feb. 7, 2018.

\* cited by examiner

WIRING STRUCTURE, DISPLAY SUBSTRATE AND DISPLAY DEVICE

CROSS REFERENCE TO RELATED APPLICATIONS

The present application is the U.S. national phase entry of PCT/CN2017/109716, with an international filing date of Nov. 7, 2017, which claims the priority of Chinese patent application No. 201710297280.0 filed on Apr. 28, 2017, the entire disclosure of which is incorporated herein by reference.

TECHNICAL FIELD

This disclosure pertains to the field of display technologies, and in particular relates to a wiring structure, a display substrate and a display device.

BACKGROUND

In order to manufacture a flexible display device, many display components made of organic materials have been developed nowadays, such as an organic light emitting layer, an organic passivation layer and a polymer substrate (e.g., a PI substrate) serving as a flexible substrate. However, it is difficult to use organic materials to replace metal wires in a display because the conductivity of an organic material is far below that of a metal wire. Nevertheless, when the flexible display device is bent, the metal wires in the display panel may be broken (the proportion of wires subjected to breakage is about 1%), which results in failures of display devices.

SUMMARY

It is an objective of this disclosure to at least relieve or alleviate the above technical problems in the prior art and provide a wiring structure less prone to breakage, a display substrate and a display device.

The wiring structure provided in the embodiments of this disclosure comprises a plurality of hollowed pattern strings, each hollowed pattern string comprising a plurality of hollowed patterns arranged sequentially in a length extension direction of the wiring structure, each hollowed pattern comprising a hollowed region and a non-hollowed region. The non-hollowed region of any hollowed pattern in a hollowed pattern string at least partially overlaps the non-hollowed region of a hollowed pattern in a further hollowed pattern string adjacent to the hollowed pattern string; and the hollowed regions of the hollowed patterns in the plurality of hollowed pattern strings do not overlap each other.

In some embodiments, each of the hollowed regions and the non-hollowed regions of the hollowed patterns has a rhombus contour; the non-hollowed region of each hollowed pattern comprises a first side, a second side, a third side and a fourth side. The second side of the non-hollowed region of a hollowed pattern in any hollowed pattern string completely overlaps the first side of the non-hollowed region of a first hollowed pattern in a further hollowed pattern string adjacent thereto; the fourth side of the non-hollowed region of a hollowed pattern in the any hollowed pattern string completely overlaps the third side of the non-hollowed region of a second hollowed pattern in the further hollowed pattern string adjacent thereto, the second hollowed pattern being adjacent to the first hollowed pattern.

Alternatively, in a further embodiment, each of the hollowed regions and the non-hollowed regions of the hollowed patterns has a rhombus contour; the non-hollowed region of each hollowed pattern comprises a first side, a second side, a third side and a fourth side. The second side of the non-hollowed region of a hollowed pattern in any hollowed pattern string partially overlaps the first side of the non-hollowed region of a first hollowed pattern in a further hollowed pattern string adjacent thereto; the fourth side of the non-hollowed region of a hollowed pattern in the any hollowed pattern string partially overlaps the third side of the non-hollowed region of a second hollowed pattern in the further hollowed pattern string adjacent thereto, the second hollowed pattern being adjacent to the first hollowed pattern.

In some embodiments, the wiring structure comprises two of the hollowed pattern strings.

In some embodiments, each hollowed pattern further comprises at least one bridging portion; the bridging portion is located in the hollowed region of the hollowed pattern and connected with the non-hollowed region of the hollowed pattern.

In some embodiments, a material of the hollowed pattern comprises a metal.

A display substrate is provided in another embodiment of this disclosure, comprising a base substrate, and the wiring structure according to any of the above embodiments arranged on the base substrate.

As mentioned in any of the above embodiments, the base substrate is a flexible substrate.

A display device is provided in yet another embodiment of this disclosure, comprising the display substrate described in the above embodiment.

DETAILED DESCRIPTION OF EMBODIMENTS

In order to help those skilled in the art to better understand the technical solutions of the embodiments of this disclosure, this disclosure will be further described in detail with reference to drawings and examples.

Figure 1:
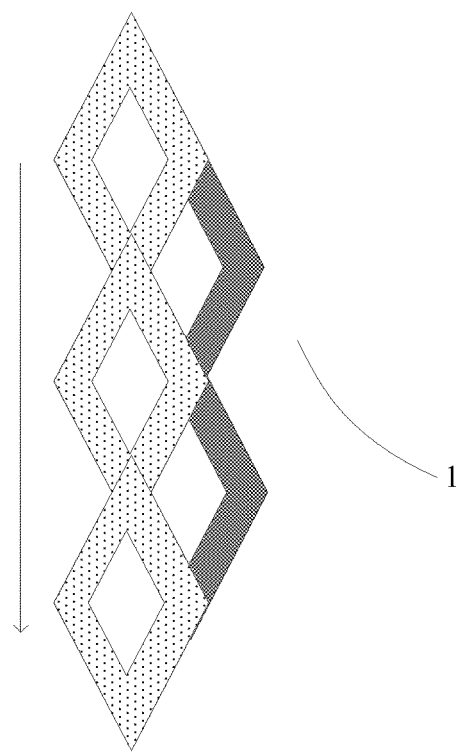
FIG. 1 is a schematic view of the wiring structure according to an embodiment of this disclosure.
Figure 2:
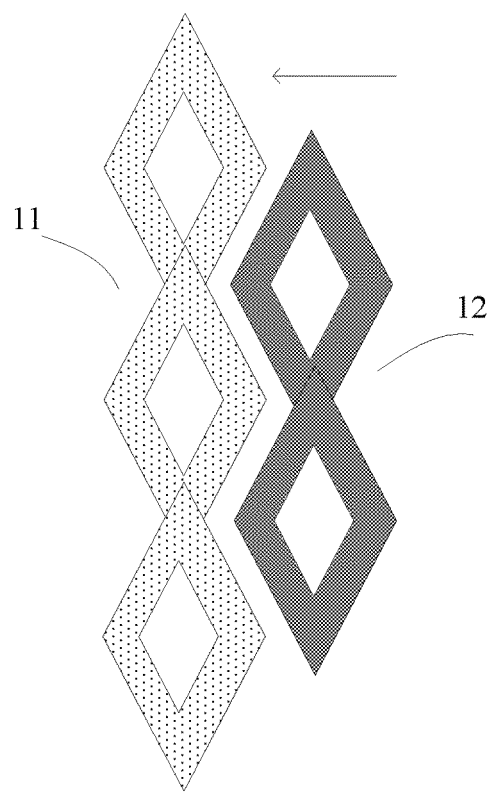
FIG. 2 schematically shows two hollowed pattern strings spaced from each other so as to clearly show the structure of each hollowed pattern string.

As shown in FIG. 1, the wiring structure 1 provided in the embodiments of this disclosure comprises a plurality of hollowed pattern strings, e.g., a first hollowed pattern string 11 and a second hollowed pattern string 12. Each hollowed pattern string comprises a plurality of hollowed patterns arranged sequentially in a length extension direction of the wiring structure 1, each hollowed pattern comprising a hollowed region and a non-hollowed region. The non-hollowed region of any hollowed pattern in a hollowed pattern string at least partially overlaps the non-hollowed region of a hollowed pattern in a further hollowed pattern string adjacent to the hollowed pattern string; and the hollowed regions of the plurality of hollowed pattern strings do not overlap each other. In order to show each structure of two adjacent hollowed pattern strings more clearly, FIG. 2 schematically shows a case in which the two hollowed pattern strings do not overlap each other at all.

It should be noted herein, the non-hollowed region of a hollowed pattern in a hollowed pattern string of two adjacent hollowed pattern strings at least partially overlapping the non-hollowed region of a hollowed pattern in the other hollowed pattern string may mean that the two adjacent hollowed pattern strings are formed either on a same layer or on different layers. In the latter case, it is possible to arrange an insulating layer between the layers of the two hollowed pattern strings during the manufacture, and after that form via holes in the insulating layer such that the two adjacent hollowed pattern strings can be electrically connected through the via holes.

Since the wiring structure in the embodiment of the disclosure comprises a plurality of hollowed pattern strings and the non-hollowed region of any hollowed pattern in a hollowed pattern string at least partially overlaps the non-hollowed region of a hollowed pattern in a further hollowed pattern string adjacent to the hollowed pattern string, this means that the plurality of hollowed pattern strings in the wiring structure are substantially arranged in a direction perpendicular to the length extension direction of the wiring structure 1. Each hollowed pattern string comprises a plurality of hollowed patterns arranged in the length extension direction of the wiring structure 1, each hollowed pattern comprising a hollowed region and a non-hollowed region. Therefore, as compared with a conventional wiring structure, the wiring structure 1 provided in the embodiment of this disclosure can release stress via the hollowed patterns when bent, stretched or twisted, thereby avoiding failures of devices on the substrate applying the wiring structure 1 in case of breakage of the wiring structure 1. Moreover, in the embodiment, the non-hollowed region of any hollowed pattern in a hollowed pattern string at least partially overlaps the non-hollowed region of a hollowed pattern in a further hollowed pattern string adjacent to the hollowed pattern string, in this way, the hollowed patterns of different hollowed pattern strings can be combined to form a wiring structure 1 in the shape of a net or a quasi-net, which can effectively avoid breakage in a joining position of any two hollowed patterns when the wiring structure 1 is bent, stretched or twisted, thereby ensuring the yield of the wiring structure 1. In particular, for a flexible substrate which is prone to be curved, with the wiring structure 1 provided in the embodiment of this disclosure, the yield of the flexible substrate can be greatly improved.

The wiring structure 1 in the embodiments of this disclosure will be explained in detail with reference to more specific examples.

Figure 3:
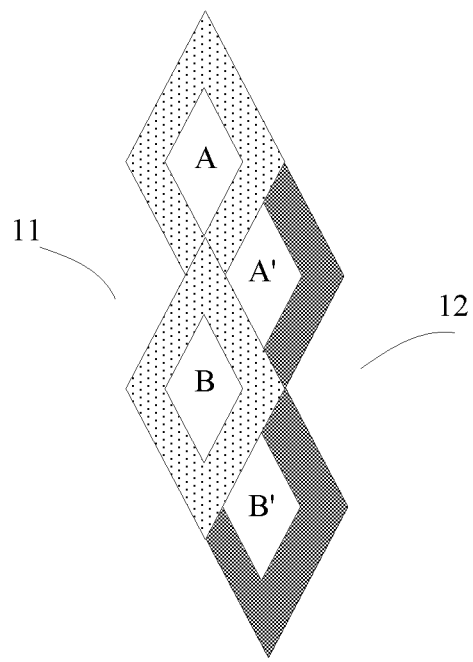
FIG. 3 is a schematic view of the wiring structure provided in an embodiment of this disclosure.
Figure 4:
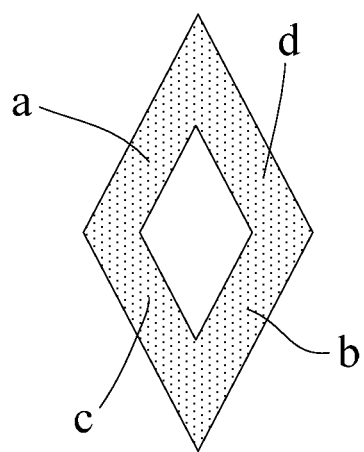
FIG. 4 is a schematic view of the hollowed pattern of the wiring structure provided in an embodiment of this disclosure.

In an example, as shown in FIG. 3 and FIG. 4, the hollowed regions and the non-hollowed regions of the hollowed patterns all have a rhombus contour. The non-hollowed region of each hollowed pattern comprises a first side a, a second side b, a third side c and a fourth side d. The second side b of the non-hollowed region of a hollowed pattern in any hollowed pattern string completely overlaps the first side a of the non-hollowed region of a first hollowed pattern in a further hollowed pattern string adjacent thereto; the fourth side d of the non-hollowed region of a hollowed pattern in the any hollowed pattern string completely overlaps the third side c of the non-hollowed region of a second hollowed pattern in the further hollowed pattern string adjacent thereto, the second hollowed pattern being adjacent to the first hollowed pattern.

As shown in FIG. 3 and FIG. 4, for example, the wiring structure 1 comprises two hollowed pattern strings, each hollowed pattern string comprising two hollowed patterns. The two hollowed pattern strings are respectively a first hollowed pattern string 11 and a second hollowed pattern string 12, the first hollowed pattern string 11 comprising hollowed pattern A and hollowed pattern B, the second hollowed pattern string 12 comprising hollowed pattern A' and hollowed pattern B'. The non-hollowed region of each of hollowed pattern A, hollowed pattern B, hollowed pattern A' and hollowed pattern B' comprises a first side a, a second side b, a third side c and a fourth side d.

The second side b of hollowed pattern A completely overlaps the first side a of the hollowed pattern A'; the fourth side d of hollowed pattern B completely overlaps the third side c of hollowed pattern A'.

Figure 5:
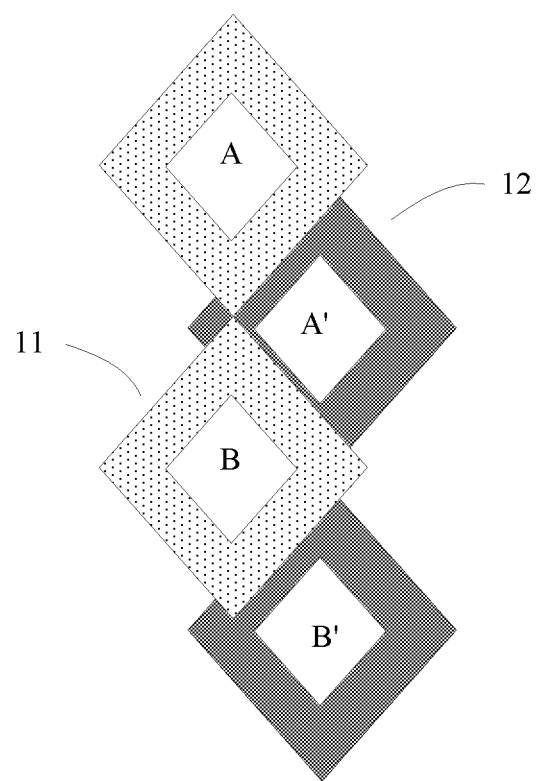
FIG. 5 is a schematic view of the wiring structure provided in another embodiment of this disclosure.

In a further example, as shown in FIG. 5, edges of the hollowed regions and the non-hollowed regions of the hollowed patterns all have a rhombus contour; likewise, the non-hollowed region of each hollowed pattern comprises a first side a, a second side b, a third side c and a fourth side d. In this example, the second side b of the non-hollowed region of a hollowed pattern in any hollowed pattern string partially overlaps the first side a of the non-hollowed region of a first hollowed pattern in a further hollowed pattern string adjacent thereto; the fourth side d of the non-hollowed region of a hollowed pattern in the any hollowed pattern string partially overlaps the third side c of the non-hollowed region of a second hollowed pattern in the further hollowed pattern string adjacent thereto, the second hollowed pattern being adjacent to the first hollowed pattern.

As shown in FIG. 4 and FIG. 5, for example, the wiring structure 1 comprises two hollowed pattern strings, each string comprising two hollowed patterns. The two hollowed pattern strings are respectively a first hollowed pattern string 11 and a second hollowed pattern string 12. The first hollowed pattern string 11 comprises hollowed pattern A and hollowed pattern B, the second hollowed pattern string 12 comprises hollowed pattern A' and hollowed pattern B'; the non-hollowed regions of hollowed pattern A, hollowed pattern B, hollowed pattern A' and hollowed pattern B' each comprises a first side a, a second side b, a third side c and a fourth side d.

The second side b of hollowed pattern A partially overlaps the first side a of hollowed pattern A'; the fourth side d of hollowed pattern B partially overlaps the third side c of hollowed pattern A'.

In further embodiments, the hollowed pattern in the wiring structure can further comprise at least one bridging portion, the bridging portion being located in the hollowed region of the hollowed pattern and connected with the non-hollowed region. For example, a first end and a second end of the bridging portion are respectively connected to different sides of the non-hollowed region of the hollowed pattern. For these embodiments, the yield of the wiring structure 1 can be further enhanced.

In an embodiment of the disclosure, a material of the hollowed pattern can comprise a metal, which can ensure a good conductivity of the wiring structure 1. Of course, other conductive materials may also be used, which will not be listed here.

A display substrate is provided in another embodiment of this disclosure, comprising a base substrate, and a wiring structure arranged on the base substrate, the wiring structure can be the wiring structure according to any of the above embodiments.

The display substrate in this embodiment can be a flexible substrate, i.e., the base substrate is made of a flexible material, such as polyimide (PI).

Since the wiring structure in the display substrate of the embodiment comprises a plurality of hollowed patterns, the wiring structure can release stress via the hollowed patterns during the process of the display substrate being curved, stretched or twisted, thereby avoiding failures of devices on the substrate applying the wiring structure in case of breakage. In particular, for a flexible substrate which is prone to be curved, with the wiring structure provided in this embodiment, the yield of the flexible substrate can be greatly improved.

A display device is provided in yet another embodiment of this disclosure, comprising the display substrate as described in the above embodiment. The display device can be a liquid crystal display device or an electroluminescent display device, or any product or component having a display function, such as a liquid crystal panel, electronic paper, an OLED panel, a cellphone, a tablet computer, a television, a display, a notebook computer, a digital photo frame, a navigator or the like.

It can be understood that what is discussed above is only exemplary embodiments adopted for illustrating the principle of the invention, but the invention is not limited thereto. For a person having ordinary skills in the art, various variations and improvements can be made without deviating from the spirit and essence of the invention, and these variations and improvements are also considered to fall within the protection scope of the invention.

The invention claimed is:

1. A wiring structure, comprising a plurality of hollowed pattern strings, each hollowed pattern string comprising a plurality of hollowed patterns arranged sequentially in a length extension direction of the wiring structure, each hollowed pattern comprising a hollowed region and a non-hollowed region, wherein the non-hollowed region of any hollowed pattern in a hollowed pattern string and the non-hollowed region of a further hollowed pattern string adjacent to the hollowed pattern string at least partially overlap in a direction perpendicular to an upper surface of the wiring structure, and hollowed regions of hollowed patterns in the plurality of hollowed pattern strings do not overlap each other.

2. The wiring structure according to claim 1, wherein each of the hollowed regions and the non-hollowed regions of the hollowed patterns has a rhombus contour, the non-hollowed region of each hollowed pattern comprises a first side, a second side, a third side and a fourth side; wherein the second side of the non-hollowed region of a hollowed pattern in any one of the plurality of hollowed pattern strings completely overlaps the first side of the non-hollowed region of a first hollowed pattern in a further hollowed pattern string adjacent thereto, the fourth side of the non-hollowed region of the hollowed pattern in the any one of the plurality of hollowed pattern strings completely overlaps the third side of the non-hollowed region of a second hollowed pattern in the further hollowed pattern string adjacent thereto, the second hollowed pattern being adjacent to the first hollowed pattern.

3. The wiring structure according to claim 1, wherein each of the hollowed regions and the non-hollowed regions of the hollowed patterns has a rhombus contour, the non-hollowed region of each hollowed pattern comprises a first side, a second side, a third side and a fourth side; wherein the second side of the non-hollowed region of a hollowed pattern in any one of the plurality of hollowed pattern strings partially overlaps the first side of the non-hollowed region of a first hollowed pattern in a further hollowed pattern string adjacent thereto;

the fourth side of the non-hollowed region of the hollowed pattern in the any one of the plurality of hollowed pattern strings partially overlaps the third side of the non-hollowed region of a second hollowed pattern in the further hollowed pattern string adjacent thereto, the second hollowed pattern being adjacent to the first hollowed pattern.

4. The wiring structure according to claim 1, wherein the wiring structure comprises two hollowed pattern strings.

5. The wiring structure according to claim 1, wherein each hollowed pattern further comprises at least one bridging portion, the bridging portion is located in the hollowed region of the hollowed pattern and connected with the non-hollowed region of the hollowed pattern.

6. The wiring structure according to claim 1, wherein a material of the hollowed pattern comprises a metal.

7. A display substrate, comprising a base substrate, and the wiring structure according to claim 1 arranged on the base substrate.

8. The display substrate according to claim 7, wherein the base substrate is a flexible substrate.

9. A display device comprising the display substrate according to claim 7.

10. The display substrate according to claim 7, wherein each of the hollowed regions and the non-hollowed regions of the hollowed patterns has a rhombus contour, the non-hollowed region of each hollowed pattern comprises a first side, a second side, a third side and a fourth side; wherein the second side of the non-hollowed region of a hollowed pattern in any one of the plurality of hollowed pattern strings completely overlaps the first side of the non-hollowed region of a first hollowed pattern in a further hollowed pattern string adjacent thereto, the fourth side of the non-hollowed region of the hollowed pattern in the any one of the plurality of hollowed pattern strings completely overlaps the third side of the non-hollowed region of a second hollowed pattern in the further hollowed pattern string adjacent thereto, the second hollowed pattern being adjacent to the first hollowed pattern.

11. The display substrate according to claim 7, wherein each of the hollowed regions and the non-hollowed regions of the hollowed patterns has a rhombus contour, the non-hollowed region of each hollowed pattern comprises a first side, a second side, a third side and a fourth side; wherein the second side of the non-hollowed region of a hollowed pattern in any one of the plurality of hollowed pattern strings partially overlaps the first side of the non-hollowed region of a first hollowed pattern in a further hollowed pattern string adjacent thereto;

the fourth side of the non-hollowed region of the hollowed pattern in the any one of the plurality of hollowed pattern strings partially overlaps the third side of the non-hollowed region of a second hollowed pattern in the further hollowed pattern string adjacent thereto, the second hollowed pattern being adjacent to the first hollowed pattern.

12. The display substrate according to claim 7, wherein the wiring structure comprises two hollowed pattern strings.

13. The display substrate according to claim 7, wherein each hollowed pattern further comprises at least one bridging portion, the bridging portion is located in the hollowed region of the hollowed pattern and connected with the non-hollowed region of the hollowed pattern.

14. The display substrate according to claim 7, wherein a material of the hollowed pattern comprises a metal.

\* \* \* \* \*